(12) United States Patent
He et al.

(10) Patent No.: US 12,544,807 B2
(45) Date of Patent: Feb. 10, 2026

(54) WAFER CLEANING APPARATUS

(71) Applicant: ACM RESEARCH (SHANGHAI), INC., Shanghai (CN)

(72) Inventors: Xideng He, Shanghai (CN); Yang Han, Shanghai (CN); Zhaoming Zhong, Shanghai (CN); Tianyu Huang, Shanghai (CN); Yunxiang Zhao, Shanghai (CN); Xiaofeng Tao, Shanghai (CN); Xinping Deng, Shanghai (CN); Shena Jia, Shanghai (CN); Hui Wang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 91 days.

(21) Appl. No.: 18/714,472

(22) PCT Filed: Nov. 24, 2022

(86) PCT No.: PCT/CN2022/133987
§ 371 (c)(1),
(2) Date: May 29, 2024

(87) PCT Pub. No.: WO2023/093799
PCT Pub. Date: Jun. 1, 2023

(65) Prior Publication Data
US 2025/0018443 A1    Jan. 16, 2025

(30) Foreign Application Priority Data
Nov. 29, 2021  (CN) .......................... 202111434855.1

(51) Int. Cl.
*B08B 3/02*      (2006.01)
*B08B 5/02*      (2006.01)
(Continued)

(52) U.S. Cl.
CPC ................ *B08B 5/023* (2013.01); *B08B 3/02* (2013.01); *B08B 3/022* (2013.01); *B08B 17/02* (2013.01);
(Continued)

(58) Field of Classification Search
None
See application file for complete search history.

(56) References Cited

U.S. PATENT DOCUMENTS

2007/0235062 A1    10/2007    Fujiwara et al.

FOREIGN PATENT DOCUMENTS

| CN | 102779772 A | 11/2012 |
|---|---|---|
| CN | 103506339 A | 1/2014 |

OTHER PUBLICATIONS

International Search Report issued in International Application No. PCT /CN2022/133987 dated Feb. 15, 2023 (2 pages).
(Continued)

*Primary Examiner* — Levon J Shahinian
(74) *Attorney, Agent, or Firm* — Osha Bergman Watanabe & Burton LLP

(57) ABSTRACT

A wafer cleaning apparatus provided by the present invention comprises a rotary shaft, a chuck arranged on the top of the rotary shaft for retaining the wafer, a fixed shaft coaxially passed through the rotary shaft, and an upper end cover and a lower end cover that block the top and bottom of the fixed shaft respectively. Wherein, the fixed shaft is a hollow shaft with at least one circle of exhaust holes provided on the wall of the fixed shaft. The lower end cover is arranged with a gas inlet port, through which a protective gas is provided to the interior of the fixed shaft. The protective gas forms a positive pressure in the annular space between the fixed shaft and the rotary shaft through the at least one circle of exhaust holes. The present invention provides positive pres-
(Continued)

sure protective gas to the spacing between the fixed shaft and the rotary shaft by opening exhaust holes on the wall of the fixed shaft. A gas seal is formed to prevent contaminants, such as particles and metals, generated in the bottom area of the rotary shaft from diffusing to the back side of the wafer through the annular space between the fixed shaft and the rotary shaft, thereby improving the cleanliness of the back side of the wafer after cleaning.

10 Claims, 5 Drawing Sheets

(51) Int. Cl.
  *B08B 17/02* (2006.01)
  *H01L 21/306* (2006.01)
  *H01L 21/67* (2006.01)
  *H01L 21/687* (2006.01)
(52) U.S. Cl.
  CPC ............ *H01L 21/306* (2013.01); *H01L 21/67* (2013.01); *H01L 21/67051* (2013.01); *H01L 21/687* (2013.01); *H01L 21/68792* (2013.01); *Y02P 70/50* (2015.11)

(56) References Cited

OTHER PUBLICATIONS

Written Opinion issued in International Application No. PCT/CN2022/133987 dated Feb. 15, 2023 (3 pages).

WAFER CLEANING APPARATUS

BACKGROUND OF THE INVENTION

Field of the Invention

The present invention relates to the field of semiconductor manufacturing technology, and more specifically, to a wafer cleaning apparatus.

The Related Art

During the wafer cleaning process, the front side of the wafer is mainly cleaned, but the smaller the semiconductor feature size, the higher the requirements for the cleanliness of the back side of the wafer. Therefore, when a single wafer cleaning apparatus is used for cleaning the wafer, the front side and the back side of the wafer are usually cleaned simultaneously.

As shown in FIG. 1, in the single wafer cleaning apparatus, a wafer 20 to be cleaned is held on a rotary chuck 10, and the rotary chuck 10 and the wafer 20 are driven to rotate by a rotary shaft 30. At the same time, a front side nozzle 40 and a back side nozzle 50 are spraying cleaning liquid on the front and the back side of the wafer 20 from the top and the bottom respectively to remove contaminants on the surface of the wafer 20.

The back side nozzle 50 is secured underneath the back side of the wafer 20 by a fixed shaft 60 which is coaxially located inside the rotary shaft 30. In the bottom area of a cleaning chamber, there is a driving mechanism 70 such as a gear and a belt, which is to drive the rotary shaft 30 to rotate. The component wear in the bottom area of the cleaning chamber may generate a large number of particles. There is a gap between the rotary shaft 30 driving the rotary chuck 10 to rotate and the fixed shaft 60 fixing the back side nozzle 50, and the gap is directly connected to the environment of the bottom area of the cleaning chamber. Since a certain negative pressure is formed between the back side of the wafer 20 and the rotary chuck 10 when the rotary chuck 10 rotates at high speed, it will cause the particulate contaminants generated in the bottom area of the cleaning chamber being sucked into the cleaning chamber along the gap between the fixed shaft 60 and the rotary shaft 30, especially the back area of the wafer (the dashed arrows in FIG. 1 show the suction path of the particulate contaminants), which will further affect the particle and metal content on the back area of the wafer.

SUMMARY

The present invention aims to provide a wafer cleaning apparatus so as to effectively reduce the contaminants of particles and metals on the back side of wafers and improve the yield of wafer cleaning.

To achieve the above objectives, the wafer cleaning apparatus provided by the present invention comprises:
- a rotary shaft, the top of the rotary shaft being provided with a chuck for holding a wafer;
- a driving mechanism, driving the rotary shaft to rotate;
- a fixed shaft, coaxially passing through the rotary shaft, with an annular space between the fixed shaft and the rotary shaft, and the fixed shaft being a hollow shaft;
- an upper end cover, blocking the top of the fixed shaft;
- a lower end cover, blocking the bottom of the fixed shaft; wherein, the wall of the fixed shaft is provided with at least one circle of exhaust holes, the lower end cover is configured with a gas inlet port through which a protective gas is provided to the interior of the fixed shaft, the protective gas forms a positive pressure in the annular space between the fixed shaft and the rotary shaft via said at least one circle of exhaust holes.

As an alternative to the present invention, each circle of said exhaust holes is disposed at equal spacing along the circumference of the fixed shaft and inclined downward.

As an alternative to the present invention, the angle between each said exhaust hole and the axis of the fixed shaft is 30° to 60°.

As an alternative to the present invention, the number of exhaust holes per circle is 40 to 60.

As an alternative to the present invention, the gas velocity of the protective gas released through the exhaust holes is more than 3 m/s.

As an alternative to the present invention, the gas pressure of the protective gas passed into the fixed shaft is not less than 30 psi.

As an alternative to the present invention, the fixed shaft is provided with at least two circles of exhaust holes.

As an alternative to the present invention, the fixed shaft is provided with at least three circles of exhaust holes.

As an alternative to the present invention, the closer the two adjacent circles of exhaust holes are to the lower end of the fixed shaft, the smaller the axial spacing between the two adjacent circles of exhaust holes.

As an alternative to the present invention, the wafer cleaning apparatus further comprises:
- a liquid inlet port, configured in the lower end cover;
- a liquid inlet tube, provided inside the fixed shaft;
- a back side nozzle, disposed on the upper end cover and connected to the liquid inlet port via the liquid inlet tube for supplying cleaning liquid to the back side of the wafer; and
- a front side nozzle, supplying cleaning liquid to the front side of the wafer.

The present invention provides a positive pressure protective gas to the gap between the fixed shaft and the rotary shaft by opening exhaust holes on the wall of the fixed shaft. A gas seal is formed to prevent particles, metals and other contaminants generated in the bottom area of the rotary shaft from diffusing to the back side of the wafer through the annular space between the fixed shaft and the rotary shaft, thereby improving the cleanliness of the back side of the wafer after cleaning.

DETAILED DESCRIPTION OF EMBODIMENTS

Figure 1:
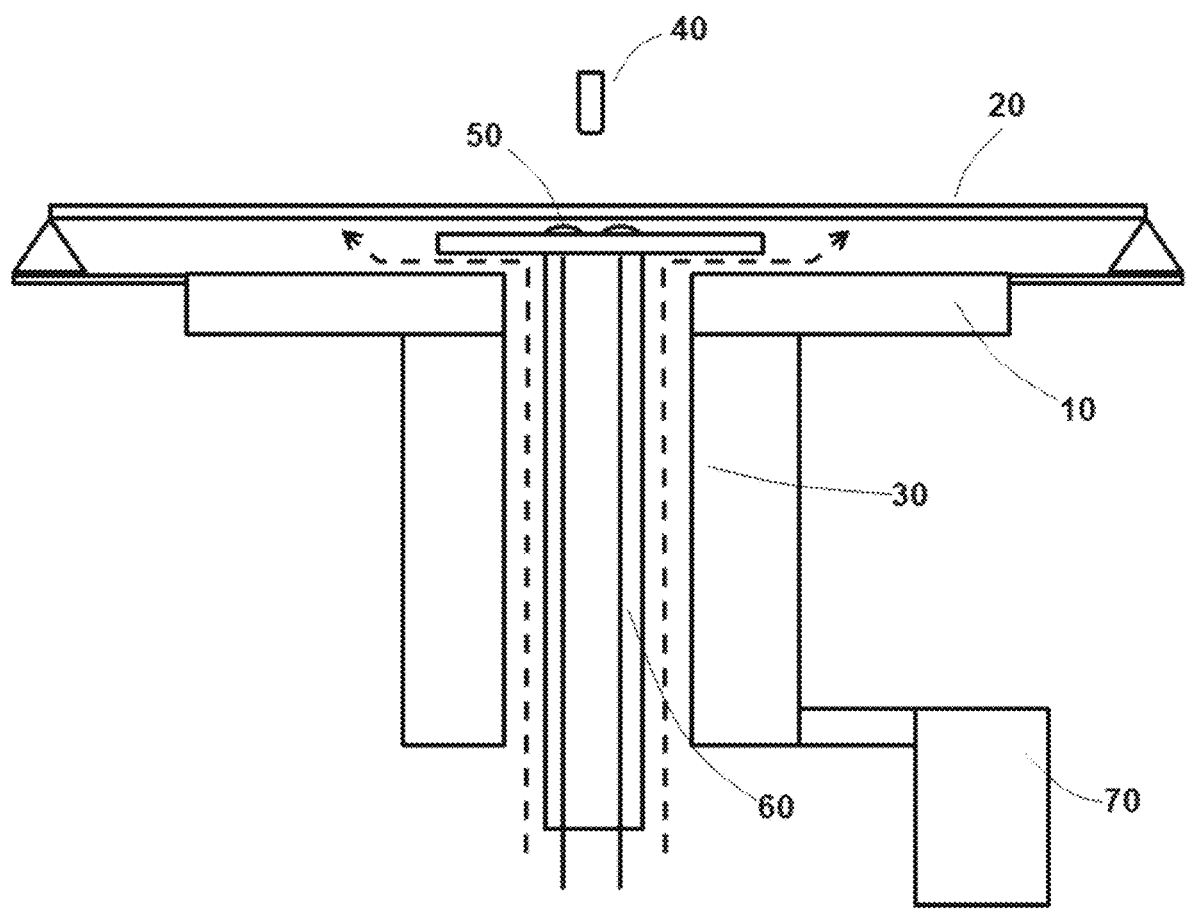
FIG. 1 is a diagram of a traditional wafer cleaning apparatus.

To provide a detailed description of the technical content, structural features, achieved objectives and effects of the present invention, the following will be described in detail with reference to embodiments and accompanying diagrams.

Referring to FIG. 2 to FIG. 5, a wafer cleaning apparatus proposed in the present invention has a rotary shaft 100 and a fixed shaft 200 coaxially passing through the rotary shaft 100. There exists an annular space between the rotary shaft 100 and the fixed shaft 200 to allow free rotation of the rotary shaft 100.

A chuck 300 is fixed on the top of the rotary shaft 100, and chucking pins 310 are provided on the chuck 300. A wafer w is held on the chuck 300 by the chucking pins 310. The bottom of the rotary shaft 100 is connected to a driving mechanism 400 for driving the rotary shaft 100 to drive the chuck 300 and the wafer w supported on the chuck 300 to rotate synchronously. In one embodiment, the driving mechanism 400 is a servo motor.

Figure 3:
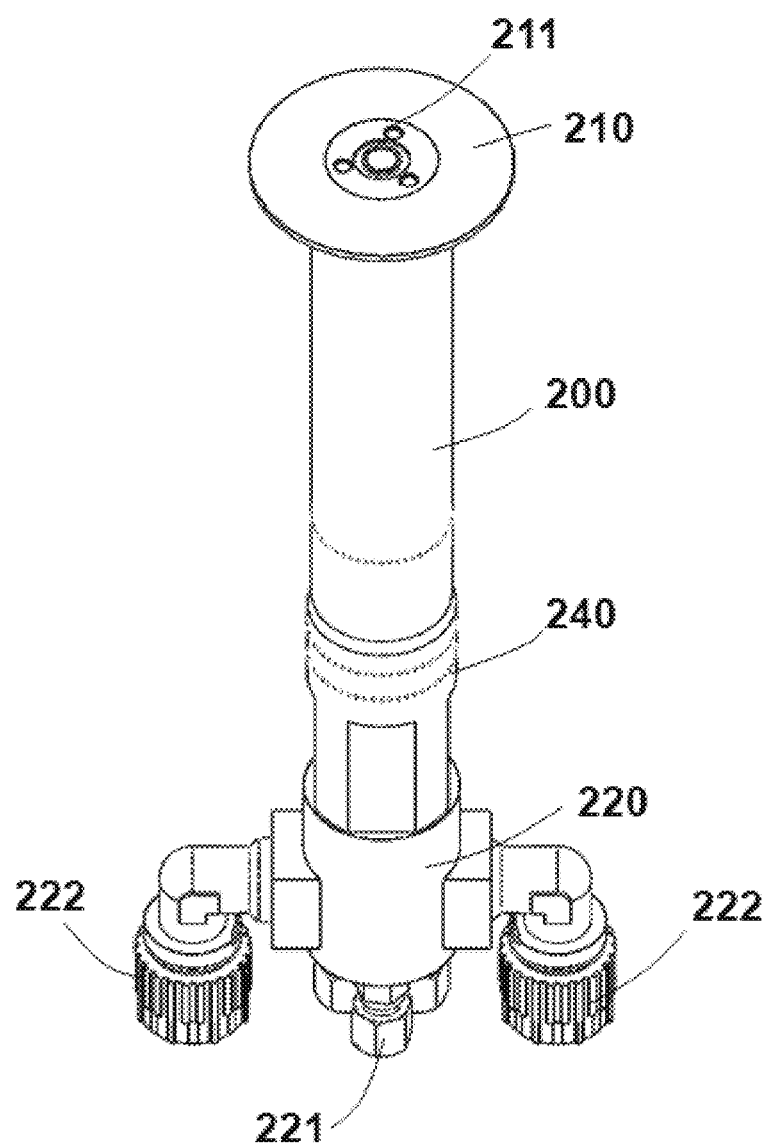
FIG. 3 is a schematic diagram of a fixed shaft in accordance with an embodiment of the present invention.
Figure 4:
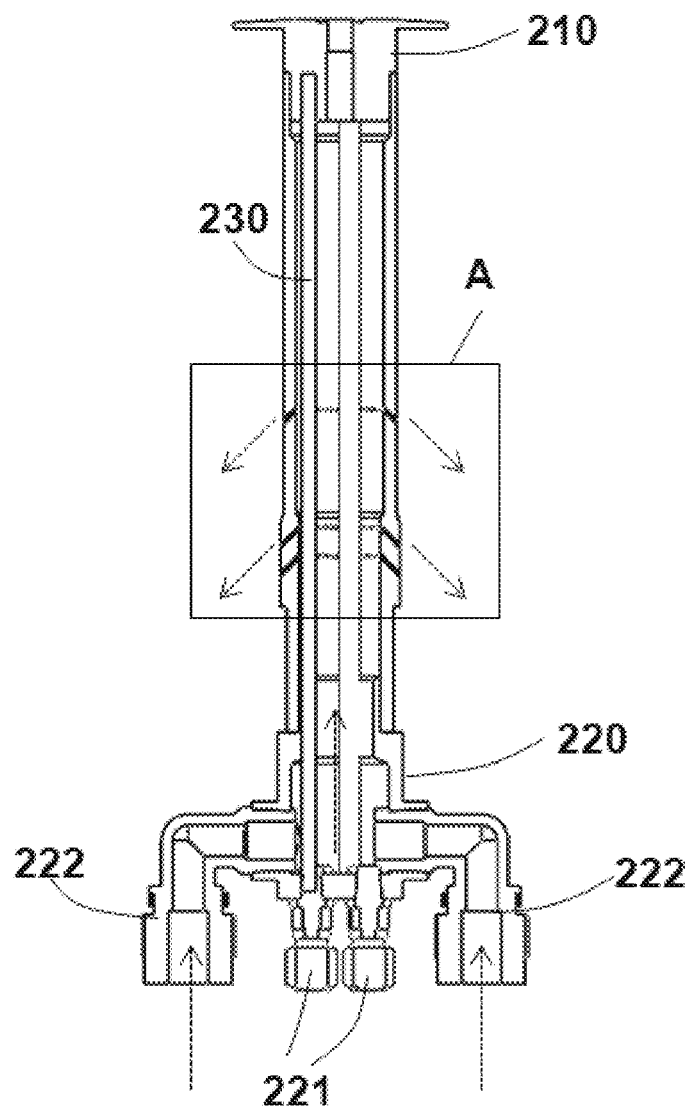
FIG. 4 is a sectional view of a fixed shaft in accordance with an embodiment of the present invention.

The fixed shaft 200 is a hollow shaft. As shown in FIG. 3 and FIG. 4, an upper end cover 210 is arranged on the top of the fixed shaft 200, and a lower end cover 220 is provided at the bottom of the fixed shaft 200. The upper end cover 210 is provided with a back side nozzle 211. The lower end cover 220 is provided with a liquid inlet port 221 and a gas inlet port 222. The fixed shaft 200 is provided with a liquid inlet tube 230. The liquid inlet port 221 is connected to the back side nozzle 211 through the liquid inlet tube 230, supplying cleaning liquid to the back side of the wafer w to remove contaminants from the back side of the wafer w.

Figure 2:
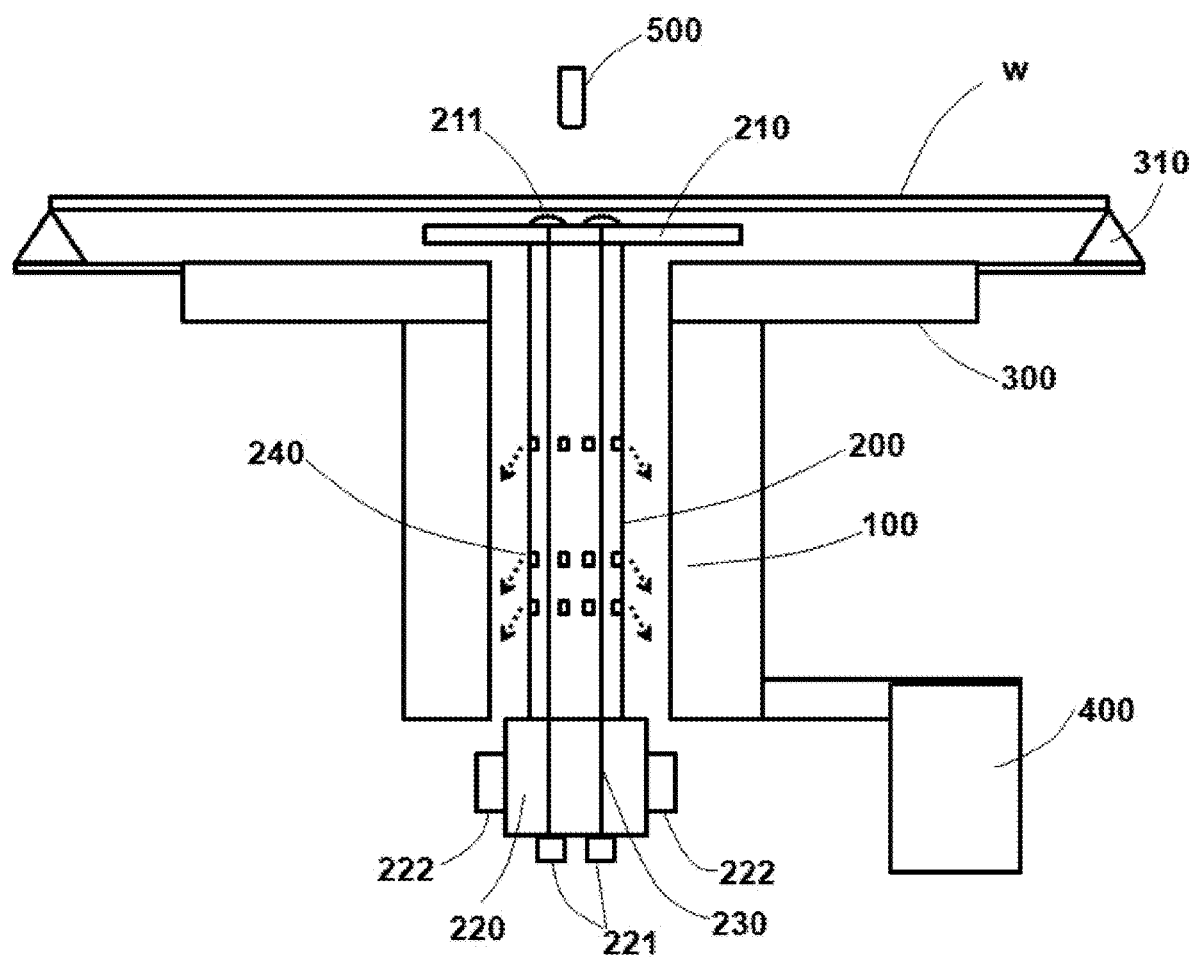
FIG. 2 is a diagram of a wafer cleaning apparatus according to an embodiment of the present invention.

As shown in FIG. 2, the wafer cleaning apparatus is further provided with a front side nozzle 500 for supplying cleaning liquid to the wafer w. Generally, the front side nozzle 500 is mounted on a swing arm, and can be driven by the swing arm to spray cleaning liquid to the wafer w from the center of the wafer w to the edge of the wafer W.

In the present embodiment, at least one circle of exhaust holes 240 is provided on the wall of the fixed shaft 200. Each circle of exhaust holes 240 comprises a number of exhaust holes. It is preferable that each circle of exhaust holes 240 is provided with 40 to 60 exhaust holes, such as 56 exhaust holes. The shape of the exhaust hole may be any shape such as circular, arcuate, rectangular, etc., and there is no specific limitation herein. When the exhaust hole is a circular hole, preferably, the diameter of the hole is 0.5 mm to 5 mm. The upper end cover 210 and the lower end cover 220 block the top and bottom of the fixed shaft 200 respectively, so that the hollow structure of the fixed shaft 200 configures as a connecting channel between at least one circle of the exhaust holes 240 and the gas inlet port 222. The arrows in FIG. 4 illustrate the flow path of the protective gas. The protective gas, e.g. $N_2$ or an inert gas, is supplied into the hollow structure of the fixed shaft 200 through the gas inlet port 222, and then enters the annular space between the rotary shaft 100 and the fixed shaft 200 through at least one circle of the exhaust holes 240, whereby a positive pressure is formed within the annular space. To ensure an effective gas seal is formed between the rotary shaft 100 and the fixed shaft 200, the protective gas is supplied to the fixed shaft 200 at a gas pressure that is not less than 30 psi, so that the gas velocity of the protective gas released through the exhaust holes 240 is greater than 3 m/s.

Each circle of the exhaust holes 240 is equally spaced along the circumferential direction of the fixed shaft 200 and is inclined downwards. The angle α between each exhaust hole 240 and the axis of the fixed shaft 200 is 30° to 60°, e.g. 45°.

To better prevent the diffusion of contaminants to the back side of the wafer w along the annular space between the rotary shaft 100 and the fixed shaft 200, multi-circles of exhaust holes 240, such as two, three or more circles, may be provided on the wall of the fixed shaft 200. By providing at least two circles of the exhaust holes 240, multilayered positive-pressure gas seal is formed in the annular space between the rotary shaft 100 and the fixed shaft 200, so as to better intercept the upward diffusion of pollutants such as particles and metals generated in the bottom area of the apparatus.

Figure 5:
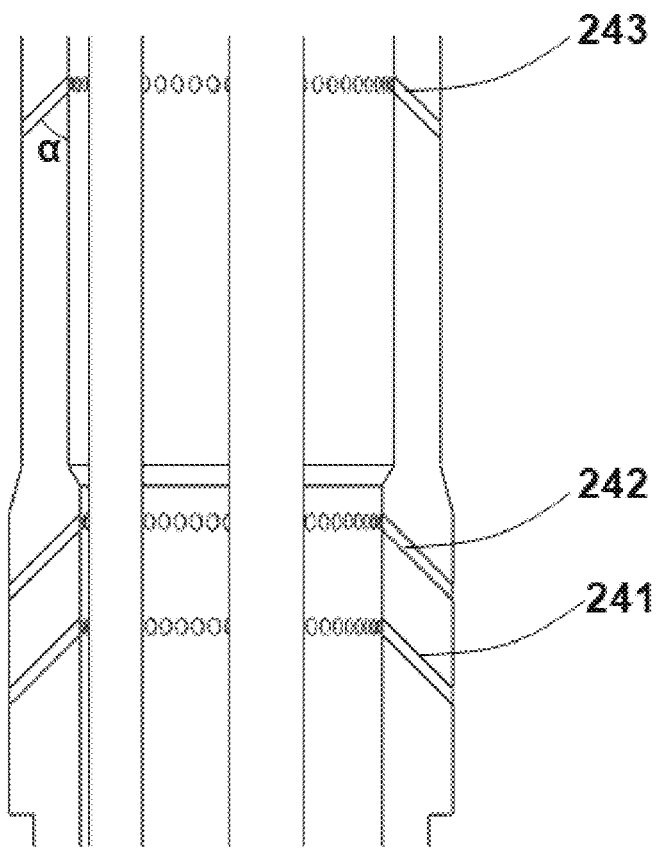
FIG. 5 is a partial enlarged view of part A in FIG. 4.

When the exhaust holes 240 are provided with at least three circles, the spacing between two adjacent circles of the exhaust holes 240 may be the same or different. It is preferable that the spacing between the two adjacent circles of exhaust holes 240 is different, and the closer the two adjacent circles of exhaust holes 240 are to the lower end of the fixed shaft 200, the smaller the axial spacing between the two adjacent circles of exhaust holes 240 is. This may make the strength of the gas sealing stronger the closer it is to the lower part of the fixed shaft 200, so as to make it difficult for the pollutants, such as particles and metals, generated in the bottom area of the apparatus to diffuse upward. As shown in FIG. 5, in the present embodiment, a first circle of exhaust holes 241, a second circle of exhaust holes 242, and a third circle of exhaust holes 243 are provided along the axis of the fixed shaft 200 from the bottom up. Wherein the axial spacing between the first circle of exhaust holes 241 and the second circle of exhaust holes 242 is smaller than the axial spacing between the second circle of exhaust holes 242 and the third circle of exhaust holes 243. Specifically, the axial spacing between the first circle of exhaust holes 241 and the second circle of exhaust holes 242 is 5 mm to 10 mm, for example, 9 mm, and the axial spacing between the second circle of exhaust holes 242 and the third circle of exhaust holes 243 is 30 mm to 50 mm, for example, 40 mm.

In summary, through the above-described embodiments and related diagrams, the present invention has disclosed the relevant technology specifically and in detail, so that technicians in the art can implement it accordingly. While the above-mentioned embodiments are only used to explain the present invention, not to limit the present invention. The scope of claims of the present invention shall be defined by the claims of the present invention. Changes in the number of components or substitution of equivalent components described herein should still fall within the scope of the claims of the present invention.

The invention claimed is:

1. A wafer cleaning apparatus, comprising:
 a rotary shaft, the top of the rotary shaft being provided with a chuck for holding a wafer;
 a driving mechanism, driving the rotary shaft to rotate;
 a fixed shaft, coaxially passing through the rotary shaft, with an annular space between the fixed shaft and the rotary shaft, the fixed shaft being a hollow shaft;
 an upper end cover, blocking the top of the fixed shaft;
 a lower end cover, blocking the bottom of the fixed shaft;
 wherein the wall of the fixed shaft is provided with at least one circle of exhaust holes, and the lower end cover is configured with a gas inlet port through which a protective gas is provided to the interior of the fixed shaft, and the protective gas forms a positive pressure in the annular space between the fixed shaft and the rotary shaft via said at least one circle of exhaust holes.

2. The wafer cleaning apparatus according to claim 1, wherein each circle of the exhaust holes is disposed at equal spacing along the circumference of the fixed shaft and inclined downward.

3. The wafer cleaning apparatus according to claim 2, wherein the angle between each said exhaust hole and the axis of the fixed shaft is 30° to 60°.

4. The wafer cleaning apparatus according to claim 1, wherein the number of exhaust holes per circle is 40 to 60.

5. The wafer cleaning apparatus according to claim 1, wherein the gas velocity of the protective gas released through the exhaust holes is more than 3 m/s.

6. The wafer cleaning apparatus according to claim 1, wherein the gas pressure of the protective gas passed into the fixed shaft is not less than 30 psi.

7. The wafer cleaning apparatus according to claim 1, wherein the fixed shaft is provided with at least two circles of exhaust holes.

8. The wafer cleaning apparatus according to claim 7, wherein the fixed shaft is provided with at least three circles of exhaust holes.

9. The wafer cleaning apparatus according to claim 8, wherein the closer the two adjacent circles of exhaust holes are to the lower end of the fixed shaft, the smaller the axial spacing between the two adjacent circles of exhaust holes.

10. The wafer cleaning apparatus according to claim 1, further comprising:
- a liquid inlet port, configured in the lower end cover,
- a liquid inlet tube, provided inside the fixed shaft;
- a back side nozzle, disposed on the upper end cover and connected to the liquid inlet port via the liquid inlet tube for supplying cleaning liquid to the back side of the wafer,
- a front side nozzle, supplying cleaning liquid to the front side of the wafer.

* * * * *